United States Patent [19]

Kato

[11] Patent Number: 5,616,448
[45] Date of Patent: Apr. 1, 1997

[54] PHOTOSENSITIVE RESIN COMPOSITION AND A PROCESS FOR FORMING A PATTERNED POLYIMIDE FILM USING THE SAME

[75] Inventor: Hideto Kato, Takasaki, Japan

[73] Assignee: Shin-Etsu Chemical Co., Ltd., Tokyo, Japan

[21] Appl. No.: 592,536

[22] Filed: Jan. 26, 1996

[30] Foreign Application Priority Data

Jan. 27, 1995 [JP] Japan ................................. 7-031605

[51] Int. Cl.$^6$ ........................................................ G03F 7/38
[52] U.S. Cl. .......................... 430/283.1; 522/99; 522/149; 522/164
[58] Field of Search .......................... 522/99, 149, 164; 430/283.1

[56] References Cited

U.S. PATENT DOCUMENTS

| | | | |
|---|---|---|---|
| 4,332,882 | 6/1982 | Ahne et al. | 430/322 |
| 4,515,887 | 5/1985 | Davis | 522/99 |
| 4,673,773 | 6/1987 | Nakano et al. | 430/283.1 |

FOREIGN PATENT DOCUMENTS 3-186847A  8/1991  Japan ................................. 430/283.1

Primary Examiner—Cynthia Hamilton
Attorney, Agent, or Firm—Cushman Darby & Cushman IP Group Pillsbury Madison & Sutro LLP

[57] ABSTRACT

The composition comprises (A) a specified polyimide precursor and (B) at least one member selected from the group consisting of a sensitizer, a photopolymerization initiator and a combination thereof. The above process comprises applying a solution of the above photosensitive resin composition on a substrate, followed by drying to form a film; exposing the film to light, followed by developing with an aqueous alkaline solution to form a patterned film; and curing the patterned film. The composition has little ionic impurities mixed therein during the preparation of the composition; is excellent in storage stability in the state of a solution; can be developed with an aqueous alkaline solution, which does not cause the problems such as a problem to health and a problem to the treatment of waste liquids, within a short time; and exhibits a good sensitivity even when formed a thick film, thereby readily providing a patterned resinous film. Further, the cured product obtained by curing the patterned film has a superior heat resistance and excellent electrical and mechanical properties, which can be suitably used as a protective film for use in electronic parts.

7 Claims, No Drawings

PHOTOSENSITIVE RESIN COMPOSITION AND A PROCESS FOR FORMING A PATTERNED POLYIMIDE FILM USING THE SAME

BACKGROUND OF THE INVENTION

1. Field of the Invention

This invention relates to a photosensitive resin composition useful for forming protective films such as insulating protective films for use in semiconductor devices, orientation films for use in liquid crystal display devices, and insulating films for use in multi-layered printed circuit boards, and to a process for forming a patterned polyimide film using said composition.

2. Description of the Prior Art

As conventional heat resistant photosensitive materials, there are known, for example, a material comprised of polyamic acid and bichromic acid salt (Japanese Patent Publication (Kokoku) No. 49-17374 corresponding to USP 3,623,870, GB 1316976 and CA 918484), a material prepared by introducing a photosensitive group into the carboxyl group of polyamic acid with the aid of an ester bond (Japanese Pre-examination Patent Publication (Kokai) No. 49-115541 and Japanese Pre-examination Patent Publication (Kokai) No. 55-45746, which correspond to USP 3,957,512 and GB 1467226), a material comprised of polyamic acid and an amine compound having a photosensitive group (Japanese Pre-examination Patent Publication (Kokai) No. 54-145794 corresponding to U.S. Pat. No. 4,243,743), and a material prepared by introducing a photosensitive group into the carboxyl group of polyamic acid with the aid of a silyl ester bond (Japanese Pre-examination Patent Publication (Kokai) No. 62-275129).

These photosensitive materials, however, are required to use, as a liquid developer, an organic solvent when forming a pattern. The use of the organic solvent involves the problems such as an affect on the operator's health and the treatment of waste liquids.

In order to solve the above problems, there have been proposed as a photosensitive material capable of developing with an aqueous liquid, for example, a material comprised of a substance prepared by introducing a photosensitive group into the carboxyl group of polyamic acid with the aid of an amido bond (Japanese Pre-examination Patent Publication (Kokai) No. 60-100143 and Japanese Pre-examination Patent Publication (Kokai) No. 2-157845, which correspond to U.S. Pat. No. 4,515,887, U.S. Pat. No. 4,587,204 and GB 2145728), a positive type photosensitive composition prepared by mixing a polyimide resin having a phenol group with naphthoquinonediazidosulfonic acid ester (Polymer Engineering and Science, July 1989, Vol. 29, 954).

These photosensitive materials, however, involve the problems that they require a long time to develop and can not exhibit a sufficient sensitivity especially when formed into a thick film.

SUMMARY OF THE INVENTION

Accordingly, an object of the present invention is to provide a photosensitive resin composition capable of developing with an aqueous liquid in a short time, as well as exhibiting a sufficient sensitivity even when formed into a thick film, thereby allowing readily to form a patterned polyimide film; and a process for forming a patterned heat resistant polyimide film using said composition.

The present inventor has earnestly studied in order to accomplish the above object and, as a result, found that when mixing a specified polyimide precursor with a sensitizer, a negative type photosensitive polyimide resin composition capable of readily developing with an aqueous alkaline solution can be obtained, that during the preparation of such a composition, ionic impurities are scarcely mixed therein, that the resulting composition exhibits a good sensitivity to irradiation of light so that a pattern can be readily formed, and that upon curing such a composition, a polyimide film excellent in heat resistance and in electrical and mechanical properties is formed. Thus, the present invention has been completed.

The present invention provides a photosensitive resin composition comprising:

(A) a polyimide precursor having an average molecular weight of at least 10,000 comprised of a structural unit represented by the following general formula (1):

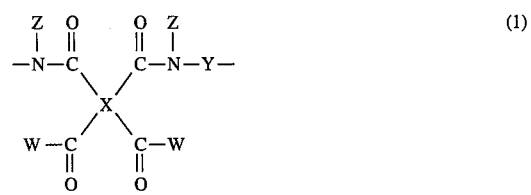

wherein X is a tetravalent organic group having an aromatic ring, Y is an aromatic ring-containing divalent organic group or a siloxane bond-containing divalent organic group, the two Z, which may be the same or different, are each a hydrogen atom or an acryloxy group- or methacryloxy group-containing monovalent organic group represented by the following general formula (2):

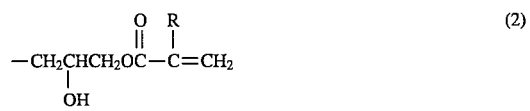

wherein R is a hydrogen atom or a methyl group, and the two W, which may be the same or different, are each a hydroxyl group or an acryloxy group- or methacryloxy group-containing amino group represented by the following general formula (3):

wherein R' is a hydrogen atom or a methyl group, provided that the content of the monovalent organic group represented by said general formula (2) accounts for at least 30 mol % of the total Z contained in the polyimide precursor and the content of the amino group represented by said general formula (3) accounts for 10 to 50 mol % of the total W contained in the polyimide precursor; and (B) one member selected from the group consisting of a sensitizer, a photopolymerization initiator, and a combination thereof.

The present invention also provides a process for forming a patterned polyimide film, comprising the steps of applying a solution of said photosensitive resin composition on a substrate, drying the same to form a film, exposing the film to light, developing the exposed film using a liquid developer, and curing the resulting patterned film, wherein as said liquid developer, an aqueous alkaline solution is used.

The photosensitive resin composition of the present invention has little ionic impurities mixed therein during the preparation of the composition; is excellent in storage stability in the state of solution; can be developed with an aqueous alkaline solution, which does not cause the problems such as a problem to health and a problem to the treatment of waste liquids, within a short time; and exhibits a good sensitivity even when formed a thick film, thereby readily providing a patterned resinous film.

Further, by heat-curing the patterned film, a polyimide film having a superior heat resistance and excellent electrical and mechanical properties is obtained, which can be suitably used as a protective film for use in electronic parts.

DETAILED DESCRIPTION OF THE PREFERRED EMBODIMENTS

The present invention is hereinafter described in more detail.
(A) Polyimide precursor The polyimide precursor (A), an effective component of the composition according to the present invention, is comprised of a structural unit represented by the above general formula (1).

The group X in the above general formula (1) is an aromatic ring-containing tetravalent organic group. A plurality of X contained in the polyimide precursor (A) may be the same or different. Typical examples of X are shown below:

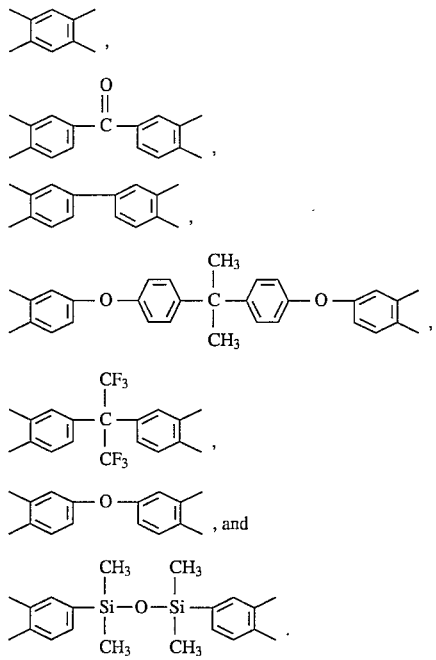

The group X is not limited to the above examples. Among these examples of X, preferred are as follows:

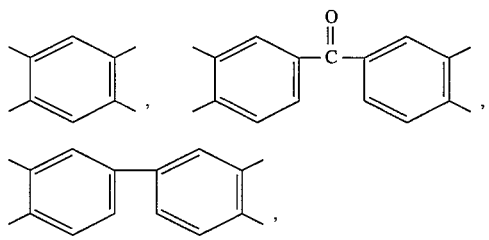

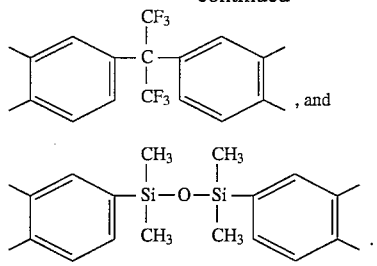

The group Y in the above general formula (1) is an aromatic ring-containing divalent organic group or a siloxane bond-containing divalent organic group. Of course, Y may be a divalent organic group having both an aromatic ring and a siloxane bond. A plurality of Y contained in the polyimide precursor (A) may be the same or different.

Specific examples of the above aromatic ring-containing divalent organic group Y are shown below:

a group represented by the following general formula (4):

wherein $R^2$ is —H, —Cl, —CONH$_2$ or an alkyl group having 1 to 3 carbon atoms [for example, —CH$_3$, —CH$_2$CH$_3$, —CH$_2$CH$_2$CH$_3$ and —CH(CH$_3$)$_2$];

a group represented by the following general formula (5):

wherein $R^1$ is a single bond, —O—, —SO$_2$—, —S— or a substituted or unsubstituted alkylene group having 1 to 3 carbon atoms [for example, —CH$_2$—, —C(CH$_3$)$_2$—, —CH$_2$CH$_2$—, —CH$_2$CH$_2$CH$_2$—, —CH$_2$CH(CH$_3$)— and —C(CF$_3$)$_2$—], and a plurality of $R^2$, which may be the same or different, are as defined above;

a group represented by the following general formula

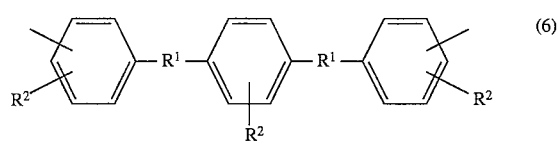

wherein a plurality of $R^1$, which may be the same or different, are as defined above, and a plurality of $R^2$, which may be the same or different, are as defined above; and a group represented by the following general formula (7):

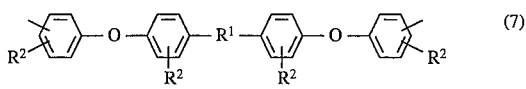

wherein $R^1$ is as defined above, and a plurality of $R^2$, which may be the same or different, are as defined above.

Specific examples of the above siloxane bond-containing divalent organic group Y are shown below:

a group having a siloxane bond represented by the following general formula (8):

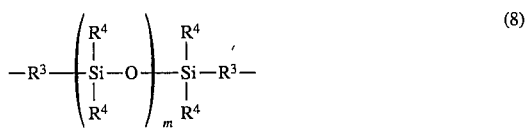 (8)

wherein a plurality of $R^3$, which may be the same or different, are each an alkylene group having 3 to 4 carbon atoms (for example, —CH$_2$CH$_2$CH$_2$— and —CH$_2$CH$_2$CH$_2$CH$_2$—), a phenylene group or a group represented by the formula:

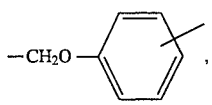, a plurality of $R^4$, which may be the same or different, are each an alkyl group having 1 to 3 carbon atoms [for example, —CH$_3$ and —CH$_2$CH$_2$CH$_3$], and m is an integer of 1 to 40.

The divalent organic group Y as exemplified above may be contained singly or in a combination of at least two groups represented by the above general formulas (4), (5), (6), (7) and (8), for example, a combination of at least one group selected from the class consisting of the groups represented by the general formulas (4), (5), (6) and (7) with the group represented by the general formula (8).

Among these examples of the divalent organic group Y, preferred are the groups represented by the general formulas (5), (7) and (8).

The two Z groups in the above general formula (1), which may be the same or different, are each a hydrogen atom, or an acryloxy group- or methacryloxy group-containing monovalent organic group represented by the following general formula (2):

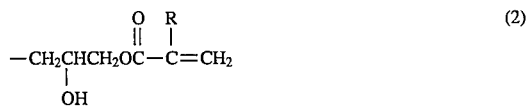 (2)

wherein R is a hydrogen atom or a methyl group. In the polyimide precursor (A), the content of the monovalent organic group represented by said general formula (2) accounts for at least 30 mol %, preferably 30 to 80 mol %, based on the total Z contained in the precursor. If the content of the monovalent organic group represented by the above general formula (2) accounts for less than 30 mol %, a sufficient sensitivity can not be obtained when prepared the photosensitive composition.

The two W groups in the above general formula (1), which may be the same or different, are each a hydroxyl group, or an acryloxy group- or methacryloxy group-containing amino group represented by the general formula (3):

—NH—CH$_2$CH$_2$OCO—C(R')=CH$_2$  (3)

wherein R' is a hydrogen or a methyl group. In the polyimide precursor (A), the content of the substituted amino group represented by the general formula (3) is 10 to 50 mol %, preferably 20 to 40 mol %, based on the total W contained in the polyimide precursor. If the content of the substituted amino group accounts for less than 10 mol %, the composition film has a too high solubility in an alkaline solution used as the liquid developer, so that it is difficult to control the time for developing. While, if the content accounts for more than 50 mol %, there occurs the problem that after exposed, the unexposed areas of the composition film can not be dissolved in the alkaline solution.

The polyimide precursor (A) has an average molecular weight (estimated as, for example, a weight-average molecular weight) of at least 10,000, preferably from 20,000 to 200,000. If the average molecular weight is less than 10,000, a cured film obtained by curing the composition film has no sufficient strength. While, if the average molecular weight is more than 200,000, a solution of the composition is too high in viscosity, so that workability is reduced and the composition is unsuitable for use.

The polyimide precursor (A) is prepared by, for example, reacting a tetracarboxylic acid dianhydride represented by the following general formula (9):

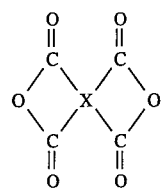 (9)

wherein X is as defined above, with a diamine compound represented by the general formula (10):

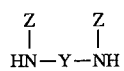 (10)

wherein Y and Z are as defined above, at usually 0° to 40° C. in a suitable solvent to produce a compound comprised of a structural unit represented by the general formula (11):

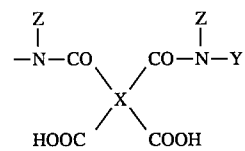 (11)

wherein X, Y and Z are as defined above; and then reacting said compound having the formula (11) with 2-isocyanato-ethyl (meth)acrylate represented by the general formula (12):

CH$_2$=C(R')—COOCH$_2$CH$_2$NCO  (12)

wherein R' is as defined above. However, methods for the preparation of the polyimide precursor (A) are not limited to the above method.

In the above preparation method, the mole number of said tetracarboxylic acid dianhydride is substantially equal to that of said diamine compound.

Examples of said diamine compound are shown below:

a compound represented by the general formula (13):

H$_2$N—Y—NH$_2$  (13)

wherein Y is as defined above;

a compound represented by the general formula (14):

 (14)

wherein Y is as defined above, and Z' is a monovalent organic group represented by the above general formula (2); and a compound represented by the general formula (15):

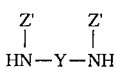  (15)

wherein Y and Z' are as defined above; provided that the diamine compounds represented by the general formulas (13) to (15) should be used in combination such that the content of Z' accounts for at least 30 mol % of the total Z (that is, the total of Z' and the hydrogen atoms bonded to the nitrogen atoms).

In the reaction between the tetracarboxylic acid dianhydride and the diamine compound, any solvents can be used. Specific examples of the solvents include organic solvents, such as N-methyl-2-pyrrolidone, dimethylacetamide, dimethylformamide, hexamethylphospholylamide, tetrahydrofuran, 1,4-dioxane, methyl cellosolve, butyl cellosolve, diethylene glycol dimethyl ether, diethylene glycol diethyl ether, triethylene glycol dimethyl ether, acetone, methyl ethyl ketone, methyl isobutyl ketone, cyclopentanone, cyclohexanone, γ-butylolactone, butyl cellosolve acetate, toluene, xylene, anisole, methyl anisole and ethyl phenyl ether. These solvents can be used singly or in a combination of two or more thereof.

The tetracarboxylic acid dianhydrides represented by the above general formula (9) include, for example, pyromellitic acid dianhydride, benzophenone tetracarboxylic acid dianhydride, 3,3',4,4'-biphenyltetracarboxylic acid dianhydride, 2,2-bis[4-(3,4-dicarboxyphenoxy)phenyl]propanoic acid dianhydride, 2,2-bis(3,4-dicarboxyphenyl)perfluoropropanoic acid dianhydride, bis(3,4-dicarboxyphenyl)dimethylsilanoic acid dianhydride and 1,3-bis(3,4-dicarboxyphenyl)-1,1,3,3-tetramethyldisiloxanoic acid dianhydride. They may be used singly or in a combination of two or more thereof. Among the above tetracarboxylic acid dianhydrides, preferred are pyromellitic acid dianhydride, benzophenone tetracarboxylic acid dianhydride, 3,3',4,4'-biphenyltetracarboxylic acid dianhydride, 2,2-bis(3,4-dicarboxyphenyl)perfluoropropanoic acid dianhydride and 1,3-bis(3,4-dicarboxyphenyl)-1,1,3,3-tetramethyldisiloxanoic acid dianhydride.

The diamine compounds represented by the general formula (13) include, for example, aromatic diamine compounds such as p-phenylenediamine, m-phenylenediamine, 4,4'-diaminodiphenylmethane, 4,4'-diaminodiphenyl ether, 2,2'-bis(4-aminophenyl)propane, 4,4'-diaminodiphenyl sulfone, 4,4'-diaminodiphenyl sulfide, 1,4-bis(3-aminophenoxy)benzene, 1,4-bis(4-aminophenoxy)benzene, 1,4-bis(p-aminophenylsulfonyl)benzene, 1,4-bis(m-aminophenylsulfonyl)benzene, 1,4-bis(p-aminophenylthioether)benzene, 1,4-bis(m-aminophenylthioether)benzene, 2,2-bis[4-(4-aminophenoxy)phenyl]propane, 2,2-bis[3-methyl-4-(4-aminophenoxy)phenyl]propane, 2,2-bis[3-chloro-4-(4-aminophenoxy)phenyl]propane, 1,1-bis[4-(4-aminophenoxy)phenyl]ethane, 1,1-bis[3-methyl-4-(4-aminophenoxy)phenyl]ethane, 1,1-bis[3-chloro-4-(4-aminophenoxy)phenyl]ethane, 1,1-bis[3,5-dimethyl-4-(4-aminophenoxy)phenyl]ethane, bis[4-(4-aminophenoxy)phenyl]methane, bis[3-methyl-4-(4-aminophenoxy)phenyl]methane, bis[3-chloro-4-(4-aminophenoxy)phenyl]methane, bis[3,5-dimethyl-4-(4-aminophenoxy)phenyl]methane, bis[4-(4-aminophenoxy)phenyl]sulfone and 2,2-bis[4-(4-aminophenoxy)phenyl]perfluoropropane; aromatic diamine compounds having an amido group represented by, for example, the following formulas:

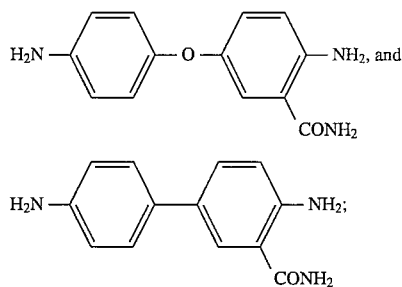

and diamino organosiloxane compounds represented by, for example, the following formulas:

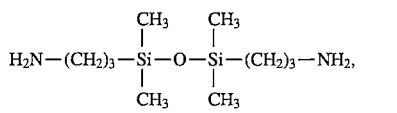

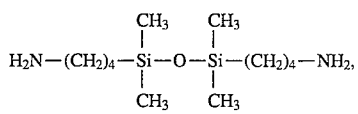

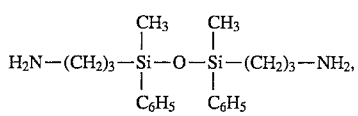

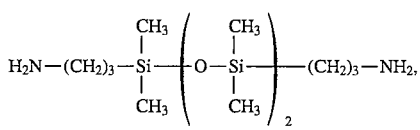

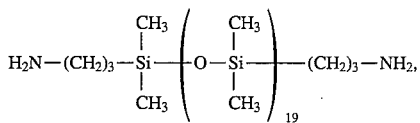

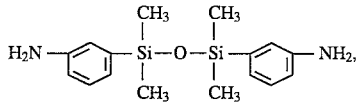

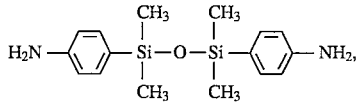

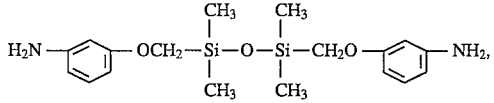

and

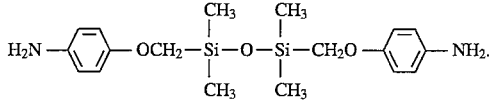

However, the diamine compounds are not limited to the above examples. They may be used singly or in a combination of two or more thereof. Among the above diamine compounds represented by the above general formula (13), preferred are as follows:

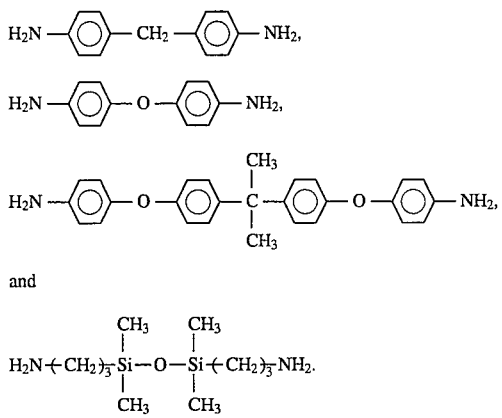

and $$H_2N+CH_2)_3-\underset{\underset{CH_3}{|}}{\overset{\overset{CH_3}{|}}{Si}}-O-\underset{\underset{CH_3}{|}}{\overset{\overset{CH_3}{|}}{Si}}+CH_2)_3-NH_2.$$

The diamine compounds having at least one group selected from an acryloxy group and a methacryloxy group represented by the above general formulas (14) and (15) can be readily prepared by reacting the diamine compound represented by the above general formula (13) with at least one compound selected from glycidyl acrylate and glycidyl methacrylate usually at 60° to 120° C. Examples (including preferable examples) of the diamine compound having the general formula (13) used herein may be the same as set forth above.

The reaction of the compound having the general formula (11) with 2-isocyanatoethyl (meth) acrylate proceeds only by mixing them at room temperature in an organic solvent. Examples of the organic solvent used herein include those exemplified above.

(B) Sensitizer, photopolymerization initiator or combination thereof

The photosensitive composition of the present invention comprises, as an effective component, at least one member selected from the group consisting of a sensitizer and a photopolymerization initiator.

The sensitizers include, for example, benzophenone, acetophenone, anthrone, phenanthrene, nitrofluorene, nitroacenaphthene, 4,4-bis(dimethylamino)benzophenone, 4,4-bis(diethylamino)benzophenone, chlorothioxanthone, benzanthraquinone, 2,6-bis(4-diethylaminobenzal)cyclohexanone, 2,6-bis(4-diethylaminobenzal)-4-methylcyclohexanone, 4,4'-bis(diethylamino)calcon, 2,4-diethylthioxanthone, N-phenyldiethanolamine, diethylaminoethyl methacrylate and coumalin compounds. However, the sensitizers are not limited the above examples. They may be used singly or in a combination of two or more thereof. Among the above sensitizers, preferred are 2,6-bis(4-diethylaminobenzal)cyclohexanone, 2,4-diethylthioxanthone, diethylaminoethyl methacrylate and coumalin compounds.

The photopolymerization initiators include, for example, benzyl, benzoin isopropyl ether, 1-hydroxycyclohexylphenylketone, 2-methyl-[4-(methylthio)phenyl]-2-morpholino-1-propane, 1-phenyl-1,2-butanedione-2-(o-methoxycarbonyl)oxime, N-phenylglycine, 3-phenyl-5-isooxazolone, biimidazoles such as 2,2-bis(o-chlorophenyl)-4,5,4',5'-tetraphenyl-1,2'-biimidazole, and camphorquinone. However, the photopolymerization initiators are not limited to the above examples. These photopolymerization initiators may be used singly or in a combination of two or more thereof. Among the above photopolymerization initiators, preferred are N-phenylglycine, 3-phenyl-5-isooxazolone and biimidazoles.

Further, the sensitizer and the photopolymerization initiator may be used in combination.

Although any amount of the component (B), namely, at least one member selected from a sensitizer and a photopolymerization initiator, can be used, it is generally 0.1 to 20% by weight, preferably 0.5 to 10% by weight, based on the polyimide precursor of the component (A).

Photosensitive resin composition

The photosensitive resin composition of the present invention is stored and used in the form of a solution in which the polyimide precursor (A) and at least one member (B) selected from the group consisting of a sensitizer and a photopolymerization initiator have been dissolved in a suitable solvent.

The above solvent suitably used herein includes, for example, the organic solvents exemplified for the preparation of the polyimide precursor (A). These organic solvents can be used singly or in a combination of two or more thereof. The amount of the organic solvent used is preferably such an amount that the concentration of the above polyimide precursor (A) is 5 to 50% by weight.

A solution of the photosensitive resin composition of the present invention dissolved in an organic solvent is applied on a substrate, such as a silicon wafer, a metal plate, a glass plate or a ceramics plate, by means of known methods, such as spin-coating, dipping and printing, followed by drying the same to form a film. The film is then subjected to processes comprising exposure to light, development with an aqueous alkaline solution and curing, whereby a patterned polyimide film excellent in characteristics such as heat resistance and the like is formed.

The formation of the film by drying can be carried out, for example, by pre-baking the applied solution or wet film at a temperature of 30° to 180° C. using a heating means such as dryer or hot plate for several minutes to several hours to remove most of the organic solvent contained in the wet film. The thickness of the dried film thus obtained is preferably about 5 to 40 μm.

The exposure is effected by superimposing a photomask on the film formed in the manner as mentioned above and then irradiating light, such as visible rays or ultraviolet rays, on the mask for several seconds to several minutes.

After the exposure, the unexposed areas of the film are dissolved and removed with a liquid developer to thereby obtain a resinous relief pattern. Since as the liquid developer, an aqueous alkaline solution is used herein, there are no problems such as an affect on health and the treatment of waste liquids. Additionally, the time required for the development may be usually about 10 seconds to 3 minutes. Examples of the aqueous alkaline solution include aqueous solutions of alkali metal hydroxides, such as sodium hydroxide and potassium hydroxide; aqueous solutions of quaternary ammonium hydroxides, such as tetramethylammonium hydroxide and tetrabutylammonium hydroxide; aqueous solutions of organic amines, such as methyldiethanolamine and triethanolamine; and preferably an aqueous solution of tetramethylammonium hydroxide.

The concentration of the aqueous alkaline solution is preferably 0.01 to 30% by weight.

Further, the resin of the relief pattern formed by the development as above is heated and cured at a temperature of usually 200° to 500° C., preferably 300° to 400° C., by a heating means such as dryer or electric furnace for several ten minutes to several hours, whereby a patterned polyimide film can be formed.

As mentioned above, since the photosensitive composition of the present invention can form readily a pattern and a polyimide resin film formed by curing said composition is excellent in heat resistance, mechanical properties and electrical properties, the photosensitive composition can be broadly used as a protective film for use in electronic parts. More specifically, it is suitably used, for example, as junction coating films on the surfaces of semiconductor devices such as diodes, transistors, I.C. and L.S.I.; passivation films; buffer coating films; α-rays shielding films in, for example, L.S.I.; insulating films between layers in multi-layered electrical wiring; and otherwise, conformal coatings in printed circuit boards; orientation films in liquid crystal display devices; and ion implantation masks.

EXAMPLES

The present invention will be more specifically described in the following with reference to working examples to which the present invention is not limited.

Preparation Example 1

Preparation of a solution (1) of the polyimide precursor

After the atmosphere within a flask equipped with a stirrer and a thermometer was replaced by nitrogen gas, 40.04 g of 4,4'-diaminodiphenyl ether, 34.04 g of glycidyl methacrylate and 355 g of N-methyl-2-pyrrolidone were charged into the flask and stirred while maintaining the temperature at 90° C. for 15 hours. The resulting reaction solution was cooled, and then the solution was analyzed by gel-permeation chromatography. As a result, it was found that the material glycidyl methacrylate disappeared and an adduct of 1 molecule of 4,4'-diaminodiphenyl ether with 1 molecule of glycidyl methacrylate and an adduct of 1 molecule of 4,4'-diaminodiphenyl ether with 2 molecules of glycidyl methacrylate were produced.

Into the above reaction solution, 58.0 g of 3,3',4,4'-benzophenonetetracarboxylic acid dianhydride and 8.52 g of 1,3-bis(3,4-dicarboxyphenyl)-1,1,3,3-tetramethyldisiloxane dianhydride were added while cooling so that the temperature of the solution might not exceed 30° C. After the completion of the addition, the solution was stirred at room temperature for 24 hours. Thereafter, to the reaction solution, 12.40 g of 2-isocyanatoethyl methacrylate was added, and the solution was stirred for additional 24 hours. During the stirring, evolution of carbon dioxide was observed. After the completion of the stirring, the reaction solution was subjected to gel-permeation chromatography and, as a result, it was confirmed that the 2-isocyanatoethyl methacrylate disappeared.

Thus, there was obtained a solution (1) (viscosity at 25° C: 2,600 cP.) of the polyimide precursor (A) having a structural unit represented by the following formula:

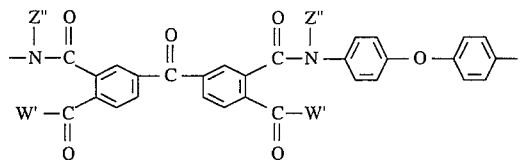

wherein Z", which may be the same or different, are a hydrogen atom or a methacryloxy-containing group represented by the following formula:

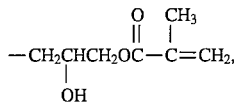

and W', which may be the same or different, are a hydroxyl group or a 2-methacryloxyethylamino group, and having a structural unit represented by the following formula:

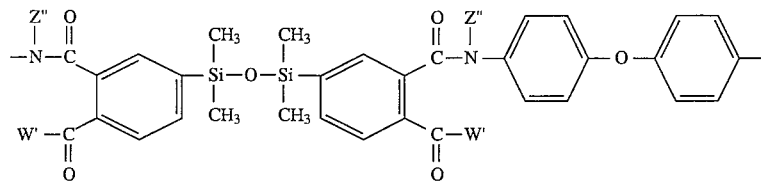

wherein Z" and W' are each as defined above; provided that the content of the methacryloxy-containing group accounts for 60 mol % of the total Z" and the content of the 2-methacryloxyethylamino group accounts for 20 mol % of the total W'. This polyimide precursor (A) had a weight-average molecular weight of about 65,000 (GPC, in terms of polystyrene).

Preparation Example 2

Preparation of a solution (2) of the polyimide precursor

After the atmosphere within a flask equipped with a stirrer and a thermometer was replaced by nitrogen gas, 39.60 g of 4,4'-diaminodiphenyl methane, 17.04 g of glycidyl methacrylate and 300 g of N-methyl-2-pyrrolidone were charged into the flask and they were stirred while maintaining the temperature at 80° C. for 20 hours. The resulting reaction solution was cooled, and then the solution was analyzed by gel-permeation chromatography. As a result, it was found that the material glycidyl methacrylate disappeared and an adduct of 1 molecule of 4,4'-diaminodiphenyl methane with 1 molecule of glycidyl methacrylate and an adduct of 1 molecule of 4,4'-diaminodiphenyl methane with 2 molecules of glycidyl methacrylate were produced.

Into the above reaction solution, 29.42 g of 3,3',4,4'-biphenyltetracarboxylic acid dianhydride and 42.60 g of 1,3-bis(3,4-dicarboxyphenyl)-1,1,3,3-tetramethyldisiloxane dianhydride were added while cooling so that the temperature of the solution might not exceed 30° C. After the completion of the addition, the solution was stirred at room temperature for 10 hours. Thereafter, to the reaction solution, 31.00 g of 2-isocyanatoethyl methacrylate was added, and the solution was stirred for additional 24 hours. During the stirring, evolution of carbon dioxide was observed. After the completion of the stirring, the reaction solution was subjected to gel-permeation chromatography and, as a result, it was confirmed that the 2-isocyanatoethyl methacrylate disappeared.

Thus, there was obtained a solution (2) (viscosity at 25° C: 4,300 cP.) of the polyimide precursor (A) having a structural unit represented by the following formula:

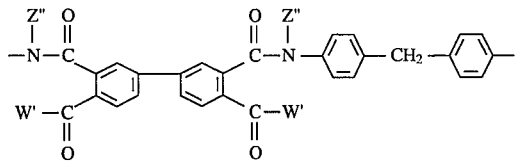

wherein Z" and W' are each as defined above, and a structural unit represented by the following formula:

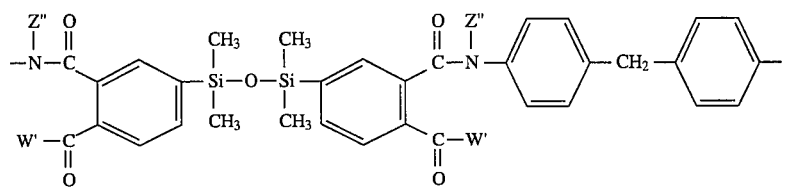

wherein Z" and W' are each as defined above; provided that the content of the methacryloxy-containing group accounts for 30 mol % of the total Z" and the content of the 2-methacryloxyethylamino group accounts for 50 mol % of the total W'. This polyimide precursor (A) had a weight-average molecular weight of about 45,000 (GPC, in terms of polystyrene).

Preparation Example 3

Preparation of a solution (3) of the polyimide precursor

After the atmosphere within a flask equipped with a stirrer and a thermometer was replaced by nitrogen gas, 73.9 g of 2,2-bis(4-aminophenoxyphenyl)propane, 28.4 g of glycidyl methacrylate and 500 g of N-methyl-2-pyrrolidone were charged into the flask and they were stirred while maintaining the temperature at 90° C. for 15 hours. The resulting reaction solution was cooled, and then the solution was analyzed by gel-permeation chromatography. As a result, it was found that the material glycidyl methacrylate disappeared and an adduct of 1 molecule of 2,2-bis(4-aminophenoxyphenyl)propane with 1 molecule of glycidyl methacrylate and an adduct of 1 molecule of 2,2-bis(4-aminophenoxyphenyl)propane with 2 molecules of glycidyl methacrylate were produced.

Into the above reaction solution, 5.0 g of 1,3-bis(3-aminopropyl)-1,1,3,3-tetramethyldisiloxane was first added, and then 88.8 g of 2,2-bis(3,4-dicarboxyphenyl)perfluoropropanoic acid dianhydride was added thereto while cooling so that the temperature of the solution might not exceed 30° C. After the completion of the addition, the solution was stirred at room temperature for 24 hours. Thereafter, to the reaction solution, 6.2 g of 2-isocyanatoethyl methacrylate was added, and the solution was stirred for additional 24 hours. During the stirring, evolution of carbon dioxide was observed. After the completion of the stirring, the reaction solution was subjected to gel-permeation chromatography and, as a result, it was confirmed that the 2-isocyanatoethyl methacrylate disappeared.

Thus, there was obtained a solution (3) (viscosity at 25° C.: 7,000 cP) of the polyimide precursor (A) having a structural unit represented by the following formula:

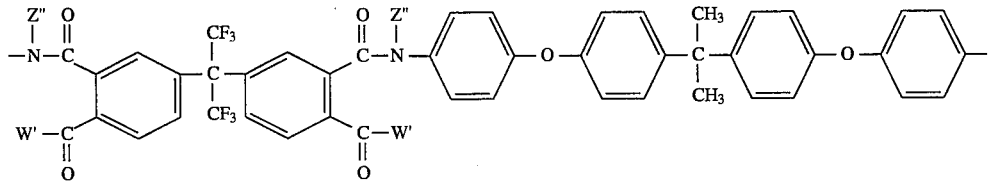

wherein Z" and W' are each as defined above, and a structural unit represented by the following formula:

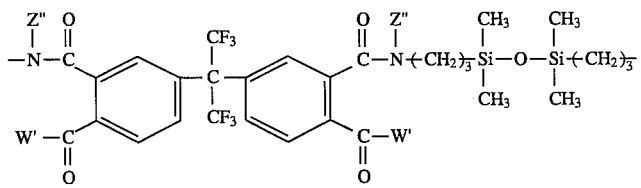

wherein Z" and W' are each as defined above; provided that the content of the methacryloxy-containing group accounts for 50 mol % of the total Z" and the content of the 2-methacryloxyethylamino group accounts for 10 mol % of the total W'. This polyimide precursor (A) had a weight-average molecular weight of about 90,000 (GPC, in terms of polystyrene).

Preparation Example 4

Preparation of a solution (4) of a polyimide precursor for comparison

After the atmosphere within a flask equipped with a stirrer and a thermometer was replaced by nitrogen gas, 40.04 g of 4,4'-diaminodiphenyl ether, 14.2 g of glycidyl methacrylate and 355 g of N-methyl-2-pyrrolidone were charged into the flask and stirred while maintaining the temperature at 90° C. for 15 hours. The resulting reaction solution was cooled, and then the solution was analyzed by gel-permeation chromatography. As a result, it was found that the material glycidyl methacrylate disappeared and an adduct of 1 molecule of 4,4'-diaminodiphenyl ether with 1 molecule of glycidyl methacrylate and an adduct of 1 molecule of 4,4'-diaminodiphenyl ether with 2 molecules of glycidyl methacrylate were produced.

Into the above reaction solution, 58.0 g of 3,3',4,4'-benzophenonetetracarboxylic acid dianhydride and 8.52 g of 1,3-bis(3,4-dicarboxyphenyl)-1,1,3,3-tetramethyldisiloxane dianhydride were added while cooling so that the temperature of the solution might not exceed 30° C. After the completion of the addition, the solution was stirred at room temperature for 24 hours. Thereafter, to the reaction solution, 12.40 g of 2-isocyanatoethyl methacrylate was added, and the solution was stirred for additional 24 hours. During the stirring, evolution of carbon dioxide was observed. After the completion of the stirring, the reaction solution was subjected to gel-permeation chromatography and, as a result, it was confirmed that the 2-isocyanatoethyl methacrylate disappeared.

Thus, there was obtained a solution (4) (viscosity at 25° C.: 3,800 cP.) of the intended polyimide precursor having a methacrylate group. In the resulting polyimide precursor, the content of the methacryloxy-containing group accounts for 25 mol % of the total Z and the content of the 2-methacryloxyethylamino group accounts for 20 mol % of the total W. This polyimide precursor had a weight-average molecular weight of about 45,000 (GPC, in terms of polystyrene).

Preparation Example 5

Preparation of a solution (5) of a polyimide precursor for comparison

After the atmosphere within a flask equipped with a stirrer and a thermometer was replaced by nitrogen gas, 40.04 g of 4,4'-diaminodiphenyl ether, 28.4 g of glycidyl methacrylate and 355 g of N-methyl-2-pyrrolidone were charged into the flask and stirred while maintaining the temperature at 90° C. for 15 hours. The resulting reaction solution was cooled, and then the solution was analyzed by gel-permeation chromatography. As a result, it was found that the material glycidyl methacrylate disappeared and an adduct of 1 molecule of 4,4'-diaminodiphenyl ether with 1 molecule of glycidyl methacrylate and an adduct of 1 molecule of 4,4'-diaminodiphenyl ether with 2 molecules of glycidyl methacrylate were produced.

Into the above reaction solution, 58.0 g of 3,3',4,4'-benzophenonetetracarboxylic acid dianhydride and 8.52 g of 1,3-bis(3,4-dicarboxyphenyl)-1,1,3,3-tetramethyldisiloxane dianhydride were added while cooling so that the temperature of the solution might not exceed 30° C. After the completion of the addition, the solution was stirred at room temperature for 24 hours. Thereafter, to the reaction solution, 3.1 g of 2-isocyanatoethyl methacrylate was added, and the solution was stirred for additional 24 hours. During the stirring, evolution of carbon dioxide was observed. After the completion of the stirring, the reaction solution was subjected to gel-permeation chromatography and, as a result, it was confirmed that the 2-isocyanatoethyl methacrylate disappeared.

Thus, there was obtained a solution (5) (viscosity at 25° C.: 2,800 cP.) of the intended polyimide precursor having a methacrylate group. In the resulting polyimide precursor, the content of the methacryloxy-containing group accounts for 50 mol % of the total Z and the content of the 2-methacryloxyethylamino group accounts for 5 mol % of the total W. This polyimide precursor had a weight-average molecular weight of about 35,000 (GPC, in terms of polystyrene).

Preparation Example 6

Preparation of a solution (6) of a polyimide precursor for comparison

After the atmosphere within a flask equipped with a stirrer and a thermometer was replaced by nitrogen gas, 40.04 g of 4,4'-diaminodiphenyl ether, 22.72 g of glycidyl methacrylate and 355 g of N-methyl-2-pyrrolidone were charged into the flask and stirred while maintaining the temperature at 90° C. for 15 hours. The resulting reaction solution was cooled, and then the solution was analyzed by gel-permeation chromatography. As a result, it was found that the material glycidyl methacrylate disappeared and an adduct of 1 molecule of 4,4'-diaminodiphenyl ether with 1 molecule of glycidyl methacrylate and an adduct of 1 molecule of 4,4'-diaminodiphenyl ether with 2 molecules of glycidyl methacrylate were produced.

Into the above reaction solution, 58.0 g of 3,3',4,4'-benzophenonetetracarboxylic acid dianhydride and 8.52 g of 1,3-bis(3,4-dicarboxyphenyl)-1,1,3,3-tetramethyldisiloxane dianhydride were added while cooling so that the temperature of the solution might not exceed 30° C. After the completion of the addition, the solution was stirred at room temperature for 24 hours. Thereafter, to the reaction solution, 34.1 g of 2-isocyanatoethyl methacrylate was added, and the solution was stirred for additional 24 hours. During the stirring, evolution of carbon dioxide was observed. After the completion of the stirring, the reaction solution was subjected to gel-permeation chromatography and, as a result, it was confirmed that the 2-isocyanatoethyl methacrylate disappeared.

Thus, there was obtained a solution (6) (viscosity at 25° C.: 2,100 cP.) of the intended polyimide precursor having a methacrylate group. In the resulting polyimide precursor, the content of the methacryloxy-containing group accounts for 40 mol % of the total Z and the content of the 2-methacryloxyethylamino group accounts for 55 mol % of the total W. This polyimide precursor had a weight-average molecular weight of about 30,000 (GPC, in terms of polystyrene).

Examples 1 to 5

To 100 parts by weight of the solution (1), (2) or (3) of the polyimide precursor prepared in Preparation Example 1, 2 or 3, the component (B) was added in an amount shown in Table 1 to prepare five kinds of photosensitive resin compositions (Examples 1 to 5).

Thereafter, a solution of each of the above compositions was applied on a silicon wafer using a spin-coater, followed by drying the applied solution on a hot plate at 90° C. for 4 minutes to form a film. Then, a stripe-pattern-carrying photomask was superimposed on the resulting film in close contact therewith, and ultraviolet rays from a 250 W extra-high pressure mercury lump was irradiated on the side of the photomask for 60 seconds. Then, development was effected with respect to each sample after the irradiation of ultraviolet rays using, as an aqueous alkaline solution, each of a 2.3 % aqueous solution of tetramethylammonium hydroxide (TMAH) and a 0.5N KOH aqueous solution. The development was carried out by dipping each sample in said alkaline solution for 1 minute. After the completion of the development, each sample was rinsed with pure water, and the form of each line-and-space pattern thus obtained was observed to measure a minimum width between lines (resolution). The results are shown in Table 1.

Further, each of the resulting samples was cured by heating at 150° C. for 0.5 hour and then at 350° C. for 1 hour in a dryer to evaluate the adhesion of the cured film to the silicon wafer according to a cross-cut adhesion test. The results are shown in Table 1.

The evaluation of the adhesion according to the cross-cut peeling test, which is effected by forming 100 squares in a cross-cut form at intervals of 1 mm on the cured film, adhering an adhesive tape to the cross-cut film, and peeling off the tape therefrom, was given by the number of the squares remained when the adhesive tape was peeled off from the cross-cut film.

of each composition into a relatively thick film, that the film can be developed with an aqueous alkaline solution, and that the film after developed has a good pattern and is also excellent in adhesion to silicon wafers so that the patterned film can be suitably used as a protective film for use in electronic parts.

Comparative Examples 1 to 3

To 100 parts by weight of the solution (4), (5) or (6) of the polyimide precursor prepared in Preparation Examples 4, 5 or 6, the component (B) was added in an amount shown in Table 2 to prepare three kinds of photosensitive resin compositions (Comparative Examples 1 to 3). Then, a film was prepared from a solution of each of the above compositions and tested for developability and adhesion, in accordance with the procedures described in Examples 1 to 5. The results are shown in Table 2.

TABLE 1

| Example | (A) Solution | (B) Sensitizer and/or photopolymerization initiator (parts by weight) | Developability/ TMAH Form of pattern | Developability/ TMAH Resolution (μm) | Developability/ KOH Form of pattern | Developability/ KOH Resolution (μm) | Adhesion Cross-cut peeling test | Film thickness after cured (μm) |
|---|---|---|---|---|---|---|---|---|
| 1 | (1) | a (1.2) b (0.3) | Good | 30 | Good | 30 | 100/100 (number peeled off: 0) | 6.5 |
| 2 | (1) | c (0.2) e (1.2) | Good | 20 | Good | 20 | 100/100 | 7.0 |
| 3 | (2) | d (0.2) e (1.2) | Good | 20 | Good | 20 | 100/100 | 7.5 |
| 4 | (2) | d (0.2) f (1.2) | Good | 20 | Good | 20 | 100/100 | 7.5 |
| 5 | (3) | d (0.2) g (1.2) | Good | 20 | Good | 20 | 100/100 | 7.5 |

[Note]
a: 2-methyl-[4-(methylthio)phenyl]-2-morpholino-1-propanone
b: 2,4-diethylthioxanthone
c: 2,6-bis(4-diethylaminobenzal)-4-methylcyclohexanone
d: carbonyl-bis(diethylaminocoumalin)
e: N-phenylglycine
f: 3-phenyl-5-isoxazolone
g: 2,2-bis(o-chlorophenyl)-4,5,4',5'-tetraphenyl-1,2'-biimidazole From the results shown in Table 1, it is understood that each of the resin compositions prepared in Examples 1 to 4 has a good sensitivity even when formed from the solution

TABLE 2

| Comp. Example | (A) Solution | (B) Sensitizer and/or photopolymerization initiator (parts by weight) | Developability/ TMAH Form of pattern | Developability/ KOH Form of pattern | Adhesion Cross-cut peeling test |
|---|---|---|---|---|---|
| 1 | (4) | c (0.2) e (1.2) | Exposed areas swelled and dissolved during development | Exposed areas swelled and dissolved during development | 100/100 (number peeled off: 0) |

TABLE 2-continued

| Comp. Example | (A) Solution | (B) Sensitizer and/or photopolymerization initiator (parts by weight) | Developability/ TMAH Form of pattern | Developability/ KOH Form of pattern | Adhesion Cross-cut peeling test |
|---|---|---|---|---|---|
| 2 | (5) | c (0.2) e (1.2) | Exposed areas swelled and dissolved during development | Exposed areas swelled and dissolved during development | 100/100 |
| 3 | (6) | c (0.2) e (1.2) | Both exposed areas and unexposed areas undissolved | Both exposed areas and unexposed areas undissolved | 100/100 |

[Note]
c: 2,6-bis(4-diethylaminobenzal)-4-methylcyclohexanone
e: N-phenylglycine

What is claimed is:

1. A photosensitive resin composition comprising:

(A) a polyimide precursor having an average molecular weight of at least 10,000 comprised of a structural unit represented by the following general formula (1):

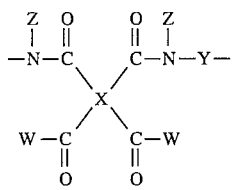  (1)

wherein X is a tetravalent organic group having an aromatic ring, Y is an aromatic ring-containing divalent organic group or a siloxane bond-containing divalent organic group, the two Z, are each independently a hydrogen atom or an acryloxy group- or methacryloxy group-containing monovalent organic group represented by the following general formula (2):

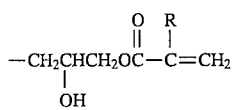  (2)

wherein R is a hydrogen atom or a methyl group, and the two are each, independently a hydroxyl group or an acryloxy group- or methacryloxy group-containing amino group represented by the following general formula (3):

—NH—CH$_2$CH$_2$OCO—C(R')=CH$_2$   (3)

wherein R' is a hydrogen atom or a methyl group, provided that the content of the monovalent organic group represented by said general formula (2) accounts for at least 30 mol % of the total Z contained in the polyimide precursor and the content of the amino group represented by the general formula (3) accounts for 10 to 50 mol % of the total W contained in the polyimide precursor; and (B) one member selected from the group consisting of a sensitizer, a photopolymerization initiator, and a combination thereof.

2. The composition of claim 1, wherein X in the general formula (1) is selected from the class consisting of the following:

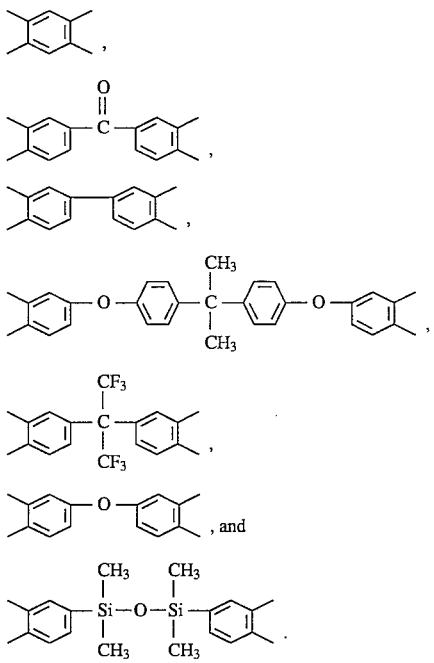

3. The composition of claim 1, wherein Y in the general formula (1) is selected from the group consisting of

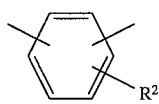   (4)

wherein $R^2$ is —H, —Cl, —CONH$_2$ or an alkyl group having 1 to 3 carbon atoms;

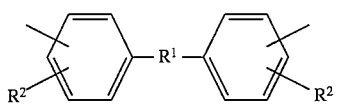   (5)

wherein $R^1$ is a single bond, —O—, —SO$_2$—, —S—, or a substituted or unsubstituted alkylene group having 1 to 3 carbon atoms, and a plurality of $R^2$ are each independently as defined above;

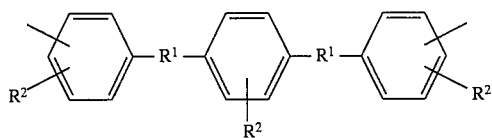 (6)

wherein a plurality of $R^1$ are each independently as defined above, and a plurality of $R^2$ are each independently as defined above;

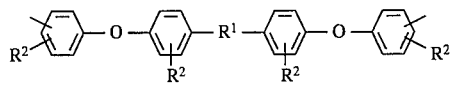 (7)

wherein $R^1$ is as defined above, and a plurality of $R^2$ are each independently as defined above; and

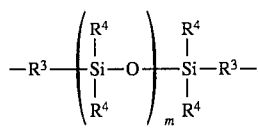

wherein a plurality of $R^3$ are each independently an alkylene group having 3 to 4 carbon atoms, a phenylene group or a group represented by the formula:

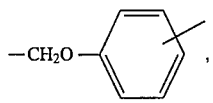, a plurality of $R^4$ are each independently an alkyl group having 1 to 3 carbon atoms, and m is an integer of 1 to 40.

4. The composition of claim 1, wherein the polyimide precursor (A) has an average molecular weight of from 20,000 to 200,000.

5. The composition of claim 1, wherein the content of the monovalent organic group represented by said general formula (2) accounts for 30 to 80 mol % of the total Z contained in the polyimide precursor and the content of the amino group represented by said general formula (3) accounts for 20 to 40 mol % of the total W contained in the polyimide precursor.

6. The composition of claim 1, wherein the polyimide precursor (A) comprises a reaction product of a compound comprised of a structural unit represented by the general formula (11):

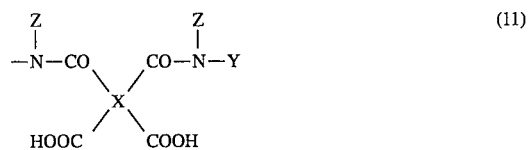 (11)

wherein X, Y and Z are as defined in claim 1, with a 2-isocyanatoethyl acrylate compound represented by the general formula (12):

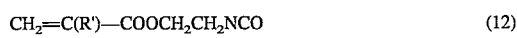 (12)

wherein R' is as defined in claim 1; said compound comprised of the structural unit having the general formula (11) being a reaction product of a tetracarboxylic acid dianhydride represented by the following general formula (9):

 (9)

wherein X is as defined in claim 1, with a diamine compound represented by the general formula (10):

 (10)

wherein Y and Z are as defined in claim 1.

7. The composition of claim 1, wherein the amount of the component (B) is 0.1 to 20% by weight based on the component (A).

* * * * *